United States Patent
Hung et al.

(10) Patent No.: US 9,425,750 B2
(45) Date of Patent: Aug. 23, 2016

(54) RADIO FREQUENCY COMMUNICATION SYSTEM AND NOISE ISOLATION METHOD APPLIED THERETO

(71) Applicant: ASUSTek COMPUTER INC., Taipei (TW)

(72) Inventors: Guo-Ying Hung, Taipei (TW); I-Tang Chung, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 14/490,686

(22) Filed: Sep. 19, 2014

(65) Prior Publication Data

US 2015/0087250 A1    Mar. 26, 2015

(30) Foreign Application Priority Data

Sep. 23, 2013  (TW) ............... 102134132 A

(51) Int. Cl.
| | | |
|---|---|---|
| *H01Q 11/12* | (2006.01) | |
| *H03F 3/191* | (2006.01) | |
| *H03H 2/00* | (2006.01) | |
| *H03H 7/09* | (2006.01) | |
| *H03H 7/52* | (2006.01) | |

(52) U.S. Cl.
CPC ............ *H03F 3/191* (2013.01); *H03H 2/006* (2013.01); *H03F 2200/294* (2013.01); *H03H 7/09* (2013.01); *H03H 7/52* (2013.01)

(58) Field of Classification Search
CPC ....... H01F 19/08; H03H 1/0007; H04B 15/04
USPC ..................................................... 455/114.3
See application file for complete search history.

(56) References Cited

U.S. PATENT DOCUMENTS

| | | | | |
|---|---|---|---|---|
| 3,585,519 | A  * | 6/1971  | Burgess .................. | H03F 3/191 327/557 |
| 7,378,851 | B1   | 5/2008  | de Rooij et al. | |
| 2001/0050987 | A1 * | 12/2001 | Yeap .................. | G10L 21/0208 379/399.01 |
| 2005/0090287 | A1   | 4/2005  | Rofougaran | |
| 2009/0221259 | A1 * | 9/2009  | Shiramizu ............ | H03D 7/1433 455/334 |
| 2011/0115565 | A1 * | 5/2011  | Cabanillas ............ | H03F 1/0277 330/307 |
| 2015/0229214 | A1 * | 8/2015  | Knoedgen ............. | H02M 3/158 323/271 |

FOREIGN PATENT DOCUMENTS

| | | | | |
|---|---|---|---|---|
| BE | EP 2629434 | A2 * | 8/2013 | .......... H03F 3/45071 |
| CN | 1545340 | A | 11/2004 | |

(Continued)

*Primary Examiner* — Edward Urban
*Assistant Examiner* — Max Mathew
(74) *Attorney, Agent, or Firm* — CKC & Partners Co., Ltd.

(57) ABSTRACT

A radio frequency communication system and a noise isolation method applied to the radio frequency communication system are provided. The radio frequency communication system includes an antenna, an amplifier and a noise isolating unit. The amplifier is electrically connected to the antenna to amplify a common-mode signal transmitted by the antenna and outputs an amplified common-mode signal. The noise isolating unit is electrically connected to the amplifier to isolate the amplified common-mode signal. The noise isolating unit includes a first transformer and a second transformer. The noise isolating unit isolates the common-mode signal and transmits the differential-mode signal, which can effectively reduce the noise and improve a signal to noise ratio without affecting the original signal.

6 Claims, 4 Drawing Sheets

(56) References Cited

FOREIGN PATENT DOCUMENTS

| | | |
|---|---|---|
| CN | 101140318 A | 3/2008 |
| EP | 2629434 A2 | 8/2013 |
| JP | 1984-63540 | 4/1984 |
| JP | 2007-036674 | 2/2007 |

* cited by examiner

RADIO FREQUENCY COMMUNICATION SYSTEM AND NOISE ISOLATION METHOD APPLIED THERETO

CROSS-REFERENCE TO RELATED APPLICATION

This application claims the priority benefit of TW application Ser. No. 102134132, filed on Sept. 23, 2011, The entirety of the above-mentioned patent applications are hereby incorporated by reference herein and made a part of specification.

BACKGROUND OF THE INVENTION

1. Field of the Invention

The invention relates to a radio frequency communication system and, more particularly, to a radio frequency communication system with a noise isolation circuit.

2. Description of the Related Art

As high requirement on electronic products, a communication device for transmitting information becomes more important. Taking a radio frequency (RE) circuit as an example, a radio frequency communication system usually uses an antenna (such a single-end antenna or a differential antenna) to exchange data. However, when the antenna receives or transmits signals, it is easily interfered by electromagnetic noise, and thus the signal outputted by the antenna may be mixed with a lot of noise, which results in a low signal to noise ratio and a signal distortion. The signal distortion may generate an error in the communication device, and the electronic device cannot transmit information correctly.

BRIEF SUMMARY OF THE INVENTION

A radio frequency communication system and a noise isolation method applied thereto are provided. The radio frequency communication system uses a noise isolating unit which includes a plurality of transformers and capacitors to isolate the noise w the signals received by an antenna, and the radio frequency communication system can improve a signal to noise ratio.

A radio frequency communication system includes an antenna, an amplifier and a noise isolating unit. The amplifier is electrically connected to the antenna to amplify a common-mode signal transmitted by the antenna and outputs an amplified common-mode signal. The noise isolating unit is electrically connected to the amplifier to isolate the amplified common-mode signal. The noise isolating unit includes a first transformer and a second transformer. The first transformer includes a first primary winding and a first secondary winding, and the first primary winding is electrically connected to the amplifier. The second transformer includes a second primary winding and a second secondary winding, and the second primary winding is electrically connected to the first secondary winding to isolate the transmission of the amplified common-mode signal.

A noise isolation method applied to a radio frequency communication system is also provided. The radio frequency communication system includes an antenna, an amplifier and a noise isolating unit. The noise isolating unit further includes a first transformer and a second transformer. The first transformer includes a first primary winding and a first secondary winding, and the first primary winding is electrically connected to the amplifier. The second transformer includes a second primary winding and a second secondary winding, and the second primary winding is electrically connected to the first secondary winding. Noise isolation method includes following steps: transmits a common-mode signal by the antenna; amplifies the common-mode signal and outputs the amplified common-mode signal by the amplifier; and isolates the transmission of the amplified common-mode signal by the noise isolating unit.

These and other features, aspects and advantages of the present invention will become better understood with regard to the following description, appended claims, and accompanying drawings.

DETAILED DESCRIPTION OF THE EMBODIMENTS

"Coupling" or "connecting" means two or more components directly or indirectly contact with each other physically or electrically, and it may also means two or more components cooperate or interact with each other.

Figure 1:
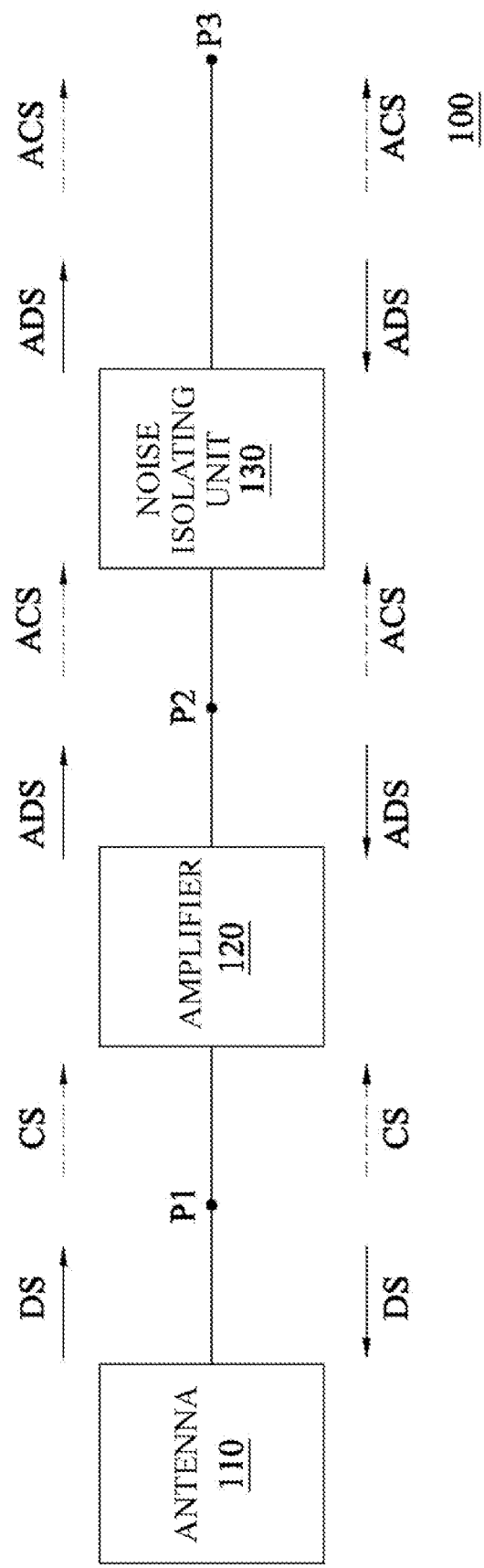
FIG. 1 is a schematic diagram showing a radio frequency communication system in an embodiment.

FIG. 1 is a schematic diagram showing a radio frequency communication system in an embodiment. As shown in FIG. 1, the radio frequency communication system 100 includes an antenna 110, an amplifier 120 and a noise isolating unit 130.

One end of the antenna 110 is electrically connected to the amplifier 120, and the other end is electrically connected to the ground GND. The antenna 110 receives a wireless signal and transmits a common-mode signal CS and a differential-mode signal DS to the amplifier 120. The common-mode signal CS may be a transmission signal related to noise, and the differential-mode signal DS may be a transmission signal related to information. In an embodiment, the antenna 110 is a single antenna.

The amplifier 120 is electrically connected to the antenna 110 to amplify the common-mode signal CS and the differential-mode signal DS transmitted by the antenna 110, and output an amplified common-mode signal ACS and an amplified differential-mode signal ADS. In order to show the differential-mode signal and the common-mode signal dearly, the differential-mode signal DS and the amplified differential-mode signal ADS are shown in a full line, the common-mode signal CS and the amplified common-mode signal ACS are shown in a dotted line in FIG. 1.

The noise isolating unit 130 is electrically connected to the amplifier 120 to transmit the amplified differential-mode signal ADS and isolate the amplified common-mode signal ACS.

Figure 2:
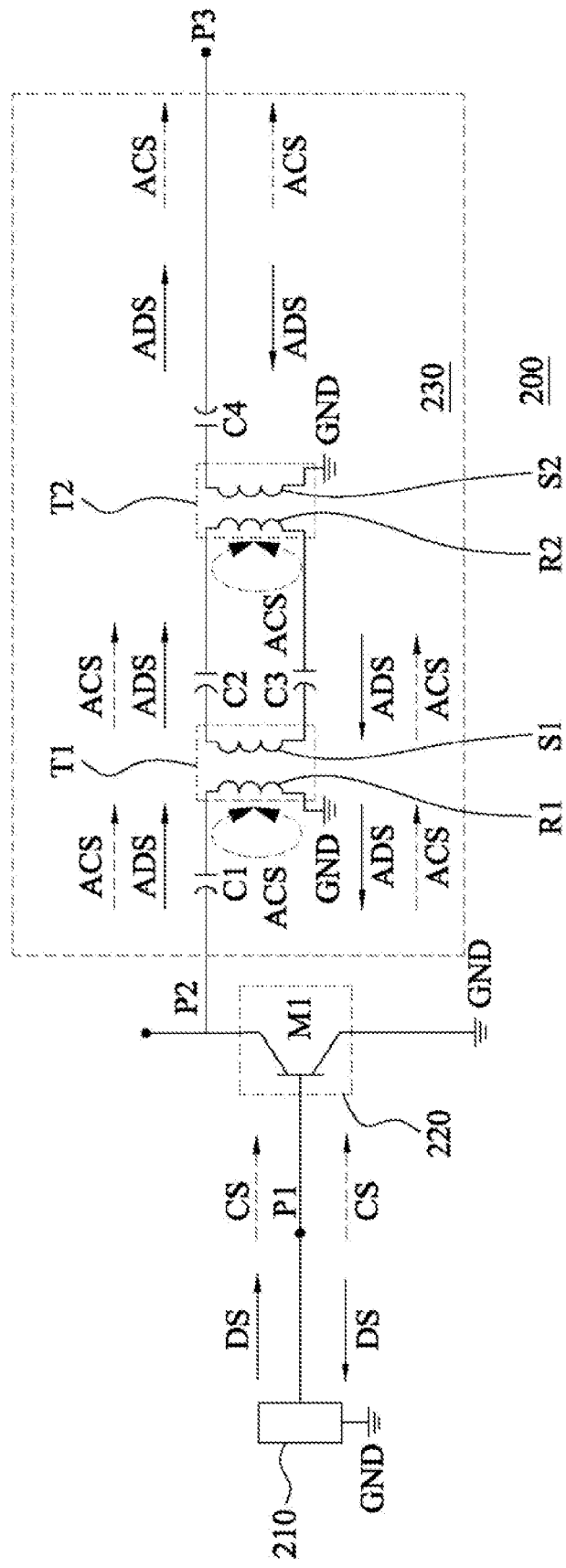
FIG. 2 is a schematic diagram showing a circuit of a radio frequency communication system in an embodiment.

FIG. 2 is a schematic diagram showing a circuit of a radio frequency communication system in an embodiment. In order to show the differential-mode signal and the common-mode signal clearly, the differential-mode signal DS and the amplified differential-mode signal ADS are shown in a full line, the common-mode signal CS and the amplified common-mode signal ACS are shown in a dotted line in FIG. 2.

In the embodiment, the amplifier 220 includes a transistor M1. A control end of the transistor M1 is electrically connected to the antenna 210, the first end of the transistor M1 is electrically connected to the noise isolating unit 230, and the second end of the transistor M1 is connected to the ground GND.

As shown in FIG. 2, the transistor M1 may be a bipolar junction transistor (BJT). A base of the transistor M1 is electrically connected to the antenna 210, a collector is electrically connected to the noise isolating unit 230, and an emitter is connected to the ground GND. The amplifier 220 in FIG. 2 may be other types of amplifying circuits or elements, which is not limited herein.

As shown in FIG. 2, the noise isolating unit 230 includes a first transformer T1 and a second transformer T2. In the embodiment, the noise isolating unit 230 further includes a first capacitor C1, a second capacitor C2, a third capacitor C3 and a fourth capacitor C4.

The first transformer T1 includes a first primary winding R1 and a first secondary winding S1. One end of the first primary winding R1 is electrically connected to the amplifier 220 via the first capacitor C1, and the other end of the first primary winding R1 is connected to the ground GND. One end of the first secondary winding S1 is electrically connected to the second capacitor C2, and the other end of the first secondary winding S1 is electrically connected to the third capacitor C3.

The second transformer T2. includes a second primary winding R2 and a second secondary winding S2. One end of the second primary winding R2 is electrically connected to one end of the first secondary winding S1 via the second capacitor C2, and the other end of the second primary winding R2 is electrically connected to the other end of the first secondary winding S1 via the third capacitor C3 to isolate the transmission of the amplified common-mode signal ACS. Moreover, one end of the second secondary winding S2 is electrically connected to the fourth capacitor C4, and the other end of the second secondary winding S2 is connected to the ground GND.

The inductance of the transformer and the capacitance of the capacitors can be obtained by impedance matching in following equations and according to practical requirements.

$$XL = \omega L \quad (1)$$

$$\omega = 1/\sqrt{LC} \quad (2)$$

In the equation (1), XL is an impedance matching value of the radio frequency communication system 100 (such as 50, Ω), ω is an angular frequency of the operation system, and L is an inductance of the transformer. As stated above, in the equation (1), the impedance L can be obtained via the known impedance matching value XL and the known angular frequency ω. Then, in the equation (2), the capacitance C of the noise isolating unit 130 can be obtained via the known angular frequency ω and the impedance L.

For example, in long term evolution (LTE) technology, when the frequency is 700, MHz, the angular frequency ω equals to 2π*700, MHz, and the impedance matching value XL of the radio frequency system is 50, Ω. Thus, the inductance and the capacitance of the noise isolating unit 130 can be obtained.

In operation, the antenna 210 may be a single-end antenna. Since one end of the single-end antenna is connected to the ground, the single antenna of the antenna 210 can be regarded as a differential antenna according to an image theory, and thus the antenna 210 can transmit the common-mode signal CS and the differential-mode signal DS.

As shown in FIG. 2, the common-mode signal CS and the differential-mode signal DS are transmitted to the amplifier 220. The amplifier 220 amplifies the common-mode signal CS and the differential-mode signal DS, and outputs the amplified common-mode signal ACS and the amplified differential-mode signal ADS. Then, the amplified common-mode signal ACS and the amplified differential-mode signal ADS are inputted to the noise isolating unit 230. Since the amplified common-mode signal ACS is an in-phase signal, it cannot be transmitted in the circuit of the radio frequency communication system 200, and a part of the amplified common-mode signal ACS is isolated by the first transformer 11 and cannot be transmitted to the second. transformer 12. On the other hand, since the amplified differential-mode signal ADS is an out of phase signal, it can be transmitted in the circuit of the radio frequency communication system 200, and it can pass through the first transformer T1 and be transmitted to the second transformer T2 completely.

Furthermore, the rest part of the amplified common-mode signal ACS passes through the first transformer T1 and is inputted to the second transformer T2. Since the amplified common-mode signal ACS is an in-phase signal, the rest part of the amplified common-mode signal ACS is isolated b the second transformer T2 and cannot be outputted. On the other hand, since the amplified differential-mode signal ADS is an out of phase signal, the amplified differential-mode signal ADS can pass through the second transformer T2 completely.

As stated above, the first transformer T1 isolates a part of the amplified common-mode signal ACS, and the second transformer 12 isolates the rest part of the amplified common-mode signal ACS. Thus, if the number of the transformers and the capacitors of the noise isolating unit 230 are large, the noise isolating effect is better, the noise is reduced, and the signal to noise ratio is improved more efficiently.

The noise isolating unit in the previous embodiment only includes two transformers and four capacitors, which is not limited herein. The person with ordinary skills in the art can change the timber of transformers and capacitors according to practical requirements, so as to get better noise isolating effect.

Figure 3A:
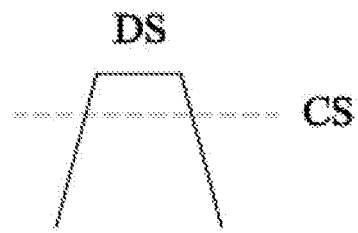
FIG. 3A is a schematic diagram showing waveforms of a common-mode signal CS and a differential-mode signal DS at a node P1 of the embodiment in FIG. 1.
Figure 3B:
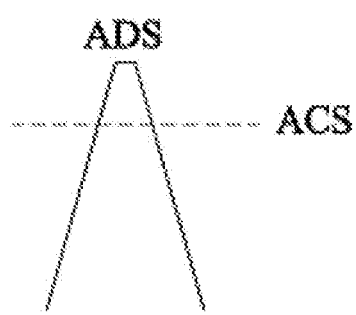
FIG. 3B is a schematic diagram showing waveforms of an amplified common-mode signal ACS and an amplified differential-mode signal ADS at a node P2 of the embodiment in FIG. 1.
Figure 3C:
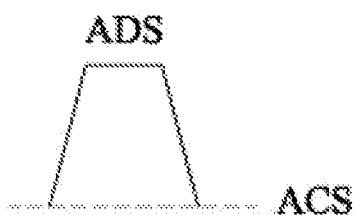
FIG. 3C is a schematic diagram showing waveforms of an amplified common-mode signal ACS and an amplified differential-mode signal ADS at a node P3 of the embodiment in FIG. 1.

FIG. 3A is a schematic diagram showing waveforms of the common-mode signal CS and the differential-mode signal DS at a node P1 of the embodiment in FIG. 1. FIG. 3B is a schematic diagram showing waveforms of the amplified common-mode signal ACS and the amplified differential-mode signal ADS at a node P2 of the embodiment in FIG 1. FIG. 3C is a schematic diagram showing waveforms of the amplified common-mode signal ACS and the amplified differential-mode signal ADS at a node P3 of the embodiment in FIG. 1. In order to show the symbols clearly, the differential-mode signal DS and the amplified differential-mode signal ADS in FIG. 3A to FIG. 3C are shown in a full line, and the common-mode signal CS and the amplified common-mode signal ACS in FIG. 3A to FIG. 3C are shown in a dotted line.

Please refer to FIG. 1 and FIG. 3A to FIG. 3C. As shown in FIG. 1, the node P1 is between the antenna 110 and the amplifier 120, the node P2 is between the amplifier 120 and the noise isolating unit 130, and the node P3 is behind the noise isolating unit 130.

As shown in FIG. 1 and FIG. 3A to FIG. 3C, after the common-mode signal CS outputted by the antenna 110 passes through the amplifier 120, the amplified common-mode signal ACS is outputted. The differential-mode signal DS is amplified by the amplifier 120 to form the amplified differential-mode signal ADS. Then, the amplified common-mode signal ACS and the amplified differential-mode signal ADS are inputted to the noise isolating unit 130, and the noise isolating unit 130 isolates the amplified common-mode signal ACS to reduce the noise signal. Additionally, after the amplified differential-mode signal ADS passes through the noise isolating unit 130, its waveform is restored to the waveform which is inputted to the amplifier 120.

As shown in FIG. 3A to FIG. 3C, the noise isolating unit 130 can reduce the noise signal and maintain the information signal, and thus it can improve the signal to noise ratio.

Furthermore, the noise isolating unit 130 which isolates the amplified common-mode signal ACS can be achieved by different means according to practical requirements. For example, a layout at a printed circuit hoard (PCB) can form an equivalent circuit of the noise isolating unit 130. In the equivalent circuit, the inductance of the transformers and the capacitance of the capacitors can be obtained via the equations in the previous embodiment. The equivalent circuit of the noise isolating unit 130 may also be achieved via low temperature co-fired ceramic (LTCC) to isolate the amplified, common-mode signal ACS, which is not limited herein.

Figure 4:
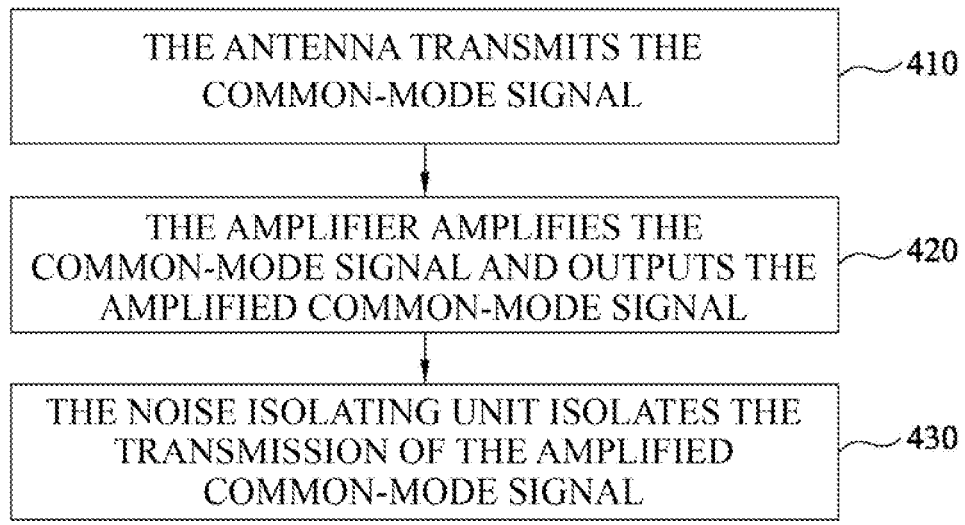
FIG. 4 is a flow chart showing a noise isolation method in an embodiment.

FIG. 4 is a flow chart showing a noise isolation method in an embodiment. The noise isolation method d 400 can be applied to the radio frequency communication system shown in FIG. 2, which is not limited herein. Please refer to FIG. 2 and FIG. 4, the noise isolation method 400 includes following steps.

First, the antenna 210 transmits the common-mode signal CS (S410). The amplifier 220 amplifies the common-mode signal CS and outputs the amplified common-mode signal ACS (S420). Then, the noise isolating unit 230 isolates the transmission of the amplified common-mode signal ACS (S430).

In an embodiment, the antenna 210 includes a single antenna. In another embodiment, the amplifier 220 includes a transistor M1. A control end of the transistor M1 is electrically connected to the antenna 210, the first end of the transistor M1 is electrically connected to the noise isolating unit 230, and the second end of the transistor M1 is connected to the ground GND.

In an embodiment, the noise isolating unit 230 includes a first transformer T1 and a second transformer T2. In another embodiment, the noise isolating unit 230 further includes a first capacitor C1, a second capacitor C2, a third capacitor C3 and a fourth capacitor C4.

The first transformer T1 includes a first primary winding R1 and a first secondary winding S1. One end of the first primary winding R1 is electrically connected to the amplifier 220 via the first capacitor C1, and the other end of the first primary winding R1 is connected to the ground GND. One end of the first secondary winding S1 is electrically connected to the second capacitor C2, and the other end of the first secondary winding S1 is electrically connected to the third capacitor C3.

The second transformer T2 includes a second primary winding R2 and a second secondary winding S2. One end of the second primary winding R2 is electrically connected to one end of the first secondary winding Si via the second capacitor C2, and the other end of the second primary winding R2 is electrically connected to the other end of the first secondary winding S1 via the third capacitor C3 to isolate the transmission of the amplified common-mode signal ACS. Moreover, one end of the second secondary winding S2 is electrically connected to the fourth capacitor C4, and the other end of the second secondary winding S2 is connected to the ground GND.

In the noise isolation method 400, since the amplified common-mode signal ACS is an in-phase signal, it cannot be transmitted in the circuit of the radio frequency communication system 200, and a part of the amplified common-mode signal ACS is isolated by the first transformer T1 and cannot be transmitted to the second transformer T2. On the other hand, since the amplified differential-mode signal ADS is an out of phase signal, it can be transmitted in the circuit of the radio frequency communication system 200, and it can pass through the first transformer T1 and be transmitted to the second transformer T2 completely.

Furthermore, a rest part of the amplified common-mode signal ACS passes through the first transformer T1 and is inputted to the second transformer T2. Since the amplified common-mode signal ACS is an in-phase signal, the rest part of the amplified common-mode signal ACS is isolated by the second transformer T2 and cannot be outputted. On the other hand, since the amplified differential-mode signal ADS is an out of phase signal, the amplified differential-mode signal ADS can pass through the second transformer T2 completely.

The sequence of the steps in the noise isolation method 400 shown in FIG. 4 can be adjusted according to practical requirements, and all or a part of the steps can be executed at the same time, which is not limited herein.

In sum, the radio frequency communication system uses the noise isolating unit to isolate the common-mode signal and transmit the differential-mode signal. Moreover, a better noise isolating effect can be obtained by adding transformers and capacitors of the noise isolating unit. Consequently, the radio frequency communication system can effectively reduce the noise and improve the signal to noise ratio without affecting the original information signal.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A radio frequency communication system, comprising; an antenna;
    an amplifier electrically connected to the antenna to amplify a common-mode signal transmitted by the antenna and outputting an amplified common-mode signal; and a noise isolating unit electrically connected to the amplifier to isolate the amplified common-mode signal, wherein the noise isolating unit includes;
    a first transformer including a first primary winding and a first secondary-winding, wherein the first primary winding is electrically connected to the amplifier;
    a second transformer including a second primary winding and a second secondary winding, wherein the second primary winding is electrically connected to the first secondary winding to isolate the transmission of the amplified common-mode signal; and a plurality of capacitors;
    wherein, the first transformer cooperates with at least one of the capacitors to isolate the transmission of a part of the amplified common-mode signal, and the second transformer cooperates with at least one of the capacitors to Isolate the -transmission of a remaining part of the amplified common-mode signal.

2. The radio frequency communication system according to claim 1, wherein the capacitors includes a first capacitor, a second capacitor, a third capacitor and a fourth capacitor;

wherein one end of the first primary winding is electrically connected to the amplifier via the first capacitor, the other end of the first primary winding is connected to a ground, one end of the first secondary winding is electrically connected to the second capacitor, and the other end of the first secondary winding is electrically connected to the third capacitor; and one end of the second primary winding is electrically connected to the second capacitor, the other end of the second primary winding is electrically connected to the third capacitor, one end of the second secondary winding is electrically connected to the fourth capacitor, and the other end of the second secondary winding is connected to the ground.

3. The radio frequency communication system according to claim 1, wherein the amplifier is a transistor, a control end of the transistor is electrically connected to the antenna, a first end of the transistor is electrically connected to the noise isolating unit, and a second end of the transistor is connected to the ground.

4. A noise isolation method applied to a radio frequency communication system, wherein the radio frequency communication system includes an antenna, an amplifier and a noise isolating unit, die noise isolating unit includes a first transformer and a second transformer and a plurality of capacitors, the first transformer includes a first primary winding and a first secondary winding, the first primary winding is electrically connected to the amplifier, die second transformer includes a second primary winding and a second secondary' winding, and the second primary winding is electrically connected to the first secondary winding, the noise isolation method comprising following steps:

transmitting a common-mode signal by the antenna;
amplifying the common-mode signal and outputting the amplified common-mode signal by the amplifier; and
isolation the transmission of a part of the amplified common-mode signal via, the cooperation of the first transformer and at least one of the capacitors of the noise isolating unit: and
isolating the transmission of a remaining part of the amplified common-mode signal via the cooperation of the second transformer and at least one of the capacitors of the noise isolating unit.

5. The noise isolation method according to claim 4, wherein the capacitors includes a first capacitor, a second capacitor, a third capacitor and a fourth capacitor;

wherein one end of the first primary winding is electrically connected to the amplifier via the first capacitor, the other end of the first primary winding is connected to a ground, one end of the first secondary winding is electrically connected to the second capacitor, and the other end of the first secondary winding is electrically connected to the third capacitor; and wherein one end of the second primary winding is electrically connected to the second capacitor, the other end of the second primary winding is electrically connected to the third capacitor, one end of the second secondary winding is electrically connected to the fourth capacitor, and the other end of the second secondary winding is connected to the ground.

6. The noise isolation method according to claim 4, wherein the amplifier is a transistor, a control end of the transistor is electrically connected to the antenna, a first end of the transistor is electrically connected to the noise isolating unit, and a second end of the transistor is connected to the ground.

* * * * *